United States Patent
Hodges, Jr. et al.

(10) Patent No.: US 8,653,510 B2
(45) Date of Patent: Feb. 18, 2014

(54) ENHANCED E-FIELD SENSING USING NEGATIVE CAPACITANCE FET SUBTHRESHOLD SLOPE ENHANCEMENT

(75) Inventors: John Hodges, Jr., Ocoee, FL (US); Marc Rippen, Clearwater Beach, FL (US); Carl Biver, Jr., Belleair, FL (US)

(73) Assignee: SRI International, Menlo Park, CA (US)

( * ) Notice: Subject to any disclaimer, the term of this patent is extended or adjusted under 35 U.S.C. 154(b) by 30 days.

(21) Appl. No.: 12/972,295

(22) Filed: Dec. 17, 2010

(65) Prior Publication Data

US 2011/0147723 A1 Jun. 23, 2011

Related U.S. Application Data

(60) Provisional application No. 61/288,194, filed on Dec. 18, 2009.

(51) Int. Cl.
*H01L 29/08* (2006.01)

(52) U.S. Cl.
USPC ...... 257/40; 257/175; 257/262; 257/E29.272; 257/E21.208

(58) Field of Classification Search
USPC ............ 257/40, 175, 262, 295, 642, 759, 257/E47.002, E27.104, E29.164, E29.272, 257/E21.208, E21.436, E21.663, E39.007, 257/E51.001, E51.01, E51.007, E51.049
See application file for complete search history.

(56) References Cited

U.S. PATENT DOCUMENTS

| | | | |
|---|---|---|---|
| 6,812,509 B2 * | 11/2004 | Xu | 257/295 |
| 7,382,041 B2 * | 6/2008 | Okada et al. | 257/642 |
| 8,105,928 B2 * | 1/2012 | Lin et al. | 438/539 |
| 8,114,704 B2 * | 2/2012 | Kim et al. | 438/99 |
| 2005/0285102 A1 * | 12/2005 | Koo et al. | 257/40 |
| 2007/0284627 A1 * | 12/2007 | Kimura | 257/257 |
| 2008/0241990 A1 * | 10/2008 | Kim et al. | 438/99 |
| 2009/0009455 A1 * | 1/2009 | Kimura | 345/89 |
| 2010/0006826 A1 * | 1/2010 | Dimmler | 257/40 |

OTHER PUBLICATIONS

Giovanni A. Salvatore, Dider Bouvet, Adrian Mihai Ionescu; Demonstration of Subthrehold Swing Smaller Than 60mV/decade in Fe-FET with P(VDF-TrFE)/SiO2 Gate Stack; Electron Devices Meeting, 2008; IEDM 2008; IEEE International, 2008; pp. 1-4; Date:2008.
Sayeef Salahuddin, Supriyo Datta; Can The Subthreshold swing in a classical FET be lowered below 60 mV/ decade?; IEEE International; Date: 2008.

(Continued)

*Primary Examiner* — Cuong Q Nguyen
*Assistant Examiner* — Yosef Gebreyesus
(74) *Attorney, Agent, or Firm* — Marger Johnson & McCollom PC

(57) ABSTRACT

In certain embodiments, a field effect transistor (FET) can include a substrate, a source electrode, a drain electrode, a ferroelectric material layer, a first gate electrode, and a second gate electrode to maintain an optimal polarization state of the ferroelectric material layer. In other embodiments, a FET can include a film, first and second gates on the film, a ferroelectric material layer covering the film and gates, an insulating layer substantially covering the ferroelectric material layer, a source and a drain on the insulating layer, and a pentacene layer.

5 Claims, 16 Drawing Sheets

(56) References Cited

OTHER PUBLICATIONS

K. Gopalakrishnan, P.B. Griffin, J.D. Plummer; I-MOS:A novel semiconductor device with a subthreshold slope lower than kT/q; IEEE Int. Electron Devices Tech. Dig.; pp. 289-292; Date: 2002.

W. Zhang, K. Bhattacharya; A computational model of ferroelectric domains. Part I: Model formulation and domain switching; Acta Materialia, vol. 53, pp. 185-198; Date: Mar. 3, 2005.

C. Lo; Simulation of thickness effect in thin ferroelectric films using Landau-Khalatnikov Theory; Journal of Applied Physics, vol. 93, No. 5, pp. 3353-3359; Date: 2003.

T. Vamsi Krishna, Jeffrey R. Jessing, Dale D. Russell, Jonathan Scaggs, Lisa R. Warner, Joe A. Hartman; Modeling and Design of Polythiophene Gate Electrode ChemFETs for Environmental Pollutant Sensing; Boise State University ScholarWorks, Department of Chemistry and Biochemistry, Chemistry Faculty Publications and Presentations; Date: Jan. 1, 2003.

\* cited by examiner

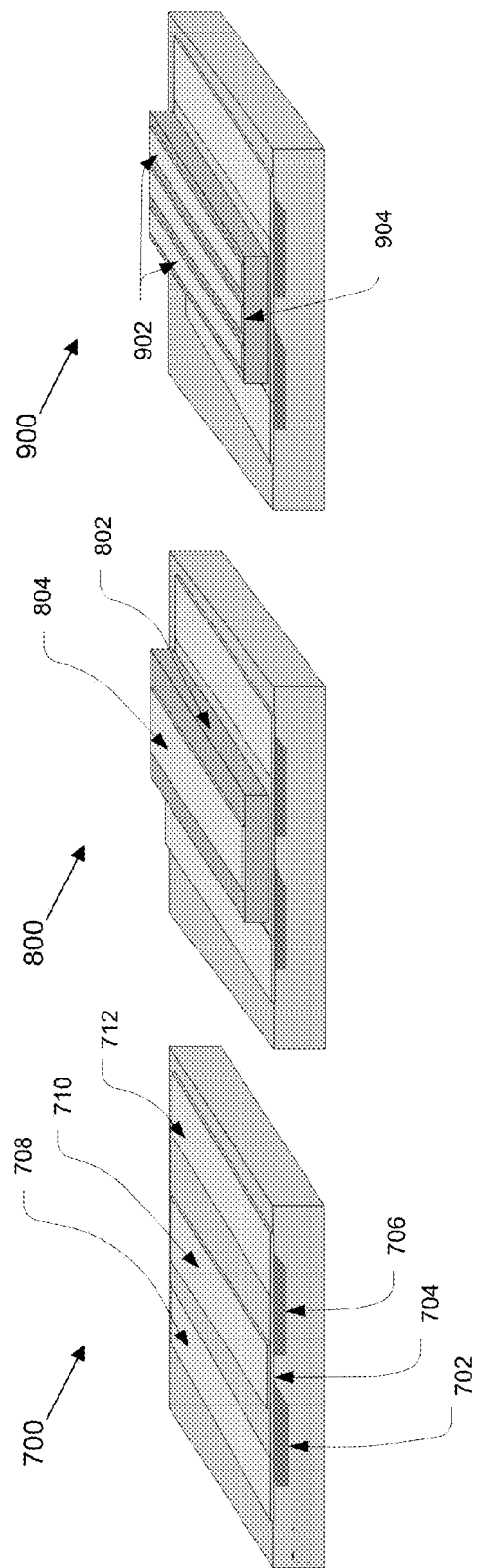

ENHANCED E-FIELD SENSING USING NEGATIVE CAPACITANCE FET SUBTHRESHOLD SLOPE ENHANCEMENT

CROSS-REFERENCE TO RELATED APPLICATION

This application claims the benefit of U.S. Provisional Patent Application Ser. No. 61/288,194, titled "ENHANCED E-FIELD SENSING USING NEGATIVE CAPACITANCE FET SUBTHRESHOLD SLOPE ENHANCEMENT" and filed on Dec. 18, 2009, which is hereby incorporated by reference in its entirety.

TECHNICAL FIELD

The disclosed technology pertains to field effect transistors (FETs).

BACKGROUND

Microsensors have been used with great success in a wide variety of applications over the years, particularly during the last decade. Market demand for chemical sensors in the United States alone is projected to surpass $5 billion by 2012. Glucose biosensors will likely be the largest type of chemical sensor, by volume, as the increasing number of diagnosed diabetics continues to boost demand for electronic blood glucose monitors.

Biomedical engineers were among the first to exploit the possibilities of microelectronic chip technology to develop silicon-based sensors. Their development of this technology provided clinicians with these sensors, which became cheaper over time. All the while, the performance of these sensors improved, following the trend in Moore's law for digital integrated circuits (ICs). This concept has developed over the years into a large family of about sixty different device types based on some form of field effect transistor (FET). For each application, the gate of the FET has been designed to make the device sensitive to either chemicals, ions, radiation, or even the voltage of individual strands of DNA. In these FETs, the normal gates are typically replaced with a sensitive metal or membrane that, in effect, acts as a collector of trapped charges/dipoles, i.e., an electric field (e-field) sensor. Due to limitations in threshold voltage gain and inefficiencies in removing trapped charges/dipoles after a sensing event, however, there are presently limitations in the sensitivity and selectivity of FET devices in these sensors.

BRIEF DESCRIPTION OF THE DRAWINGS

FIG. 7 illustrates an example of a conventional FET.

FIG. 8 illustrates an example of a Salvatore-Inoescu FET.

FIG. 9 illustrates an example of a modified FET in accordance with certain embodiments of the disclosed technology.

DETAILED DESCRIPTION

Figure 1:
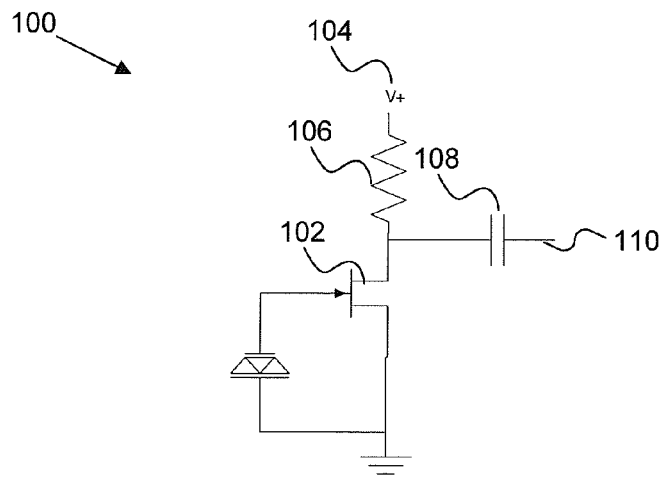
FIG. 1 illustrates an example of a typical electric microphone preamp circuit that uses a two-terminal electric capsule having a field effect transistor (FET) in a common source configuration.

A field effect transistor (FET) is typically used as the first stage of a charge amplifier that feeds other amplifier stages to produce an amplified charge signal, which is in turn supplied to a processing unit. The processing unit is generally arranged to measure the charge signal to provide information relating to the conditions experienced by the transducer. Because it is typical for the charge signal to change increase in only one direction, for example, the accumulated charge should be removed before the system starts to saturate and become non-linear. This is a process commonly known as "restore."

In certain embodiments, electric field (e-field) sensors are used to detect small electric fields over large frequency ranges while being relatively compact and power-efficient. These sensors may be used in implementing a superior, cost-effective, scalable solution for meeting applications that require this capability with a significant increase in sensitivity. These sensors may be used in 0.5-to-2 GHz ultra-wideband-based technologies.

The disclosed techniques may be implemented with respect to FETs to encourage and further advances in the parallel commercial microsensor market as well as the military microsensor market. Sensors for dynamic e-fields are of considerable practical interest because of the variety of uses to which such sensor may be adapted. Examples are often seen in the direct sensing of biological electromagnetic signals such as electroencephalography (EEG) and electrocardiography (EKG). Another application of note is in the detection and characterization of e-fields as generated by vehicles and other moving machinery.

Implementations of the disclosed techniques may allow for significant cost reduction, sensor miniaturization, and greater precision, all of which can be used to expand the use of these sensors into new markets or into new applications within existing markets. The impacted market segments may include, but are not limited to, the medical market and various chemical sensor outlets such as industrial, environmental, and military applications, for example.

Certain implementations of a gain-enhanced FET (GE-FET) combine the charge collector, charge amplifier, and analog-to-digital converter circuits into a single structure. The charge collection may be accomplished by replacing the conventional gate insulator with a ferroelectric material. This type of material presents a region of negative capacitance in its Q-V curve, i.e., charge vs. applied voltage. As used herein, negative capacitance refers to a situation in which, by increasing the applied voltage, the stored charge decreases. This negative capacitance may provide a mechanism for amplifying the surface potential.

The collected charge in these embodiments may be amplified as a result of the step-up voltage transformer action made possible by the effective negative capacitance provided by the ferroelectric capacitor. The voltage transformer action can be understood intuitively as the result of an effective negative capacitance provided by the ferroelectric capacitor that arises from the internal positive feedback.

In certain embodiments, a gain-enhanced FET (GE-FET) having a negative capacitance in the gate can be used to create a "step-up transformer" to amplify the electrical charge at the gate to cause the transistor to switch "on" at lower signal levels. Unlike certain current technologies, there is little to no concern for the disclosed technology with respect to the switching speed of because most of the signals have frequency content that is below 60 Hz. In a direct e-field sensor, for example, the electric gate is augmented in a FET by a ferroelectric material and the gate is exposed to electromagnetic fields in order to sense them in the most efficient manner possible.

The disclosed technology provides various advantageous features such as exposing the ferroelectric gate to electromagnetic fields in order to sense these fields, consolidating the ferroelectric and the FET to aid manufacturability in planar technologies, and lowering the operating voltage of organic FETs as compared to Si FETs using a Pentacene/PVDF (poly(vinylidene fluoride)) combination instead of conventional Pentacene in order to build flexible sensors.

The disclosed techniques may also provide a flexible circuit that can change its analog properties on-the-fly because the total accumulated charge can be controlled by the bias on the gate region. If this bias is driven by a waveform, i.e., voltage vs. time, that alternatively stabilizes and destabilizes the negative capacitance segment, the FET can effectively sample the charge and hence the e-field, thereby performing discretization of the input allowing direct conversion of the e-field into a usable electronic signal.

Certain implementations allow for elimination of the antenna and impedance matching circuit to increase bandwidth by directly driving the gate of the transistor, which can help to overcome the sensitivity limitations of conventional e-field detectors. In certain embodiments, the area of the ferroelectric gate can be increased in order to increase sensitivity. An additional restore/polarization gate may be used to improve switching performance.

E-Field Sensors

Basic electrostatics physics rely on the principal that like electrical charges repel and unlike charges attract. An electric force field, referred to herein as an electric field or e-field, is said to exist around these electrical charges. An electric field defines the force per charge ($E=F/q$), and has both a magnitude and direction, i.e., a vector quantity. The units of an electric field are Newtons/Coulomb, or more commonly Volts/meter (V/m).

The last 40 years have seen a significant increase in interest in electromagnetic field sensors and, in particular, the effects of electric and magnetic fields at frequencies less than 100 kHz. In fact, electromagnetic field sensing has become a critical component of various other sensors in scientific and technical areas such as chemical process control, biological sensing, and military applications as well as e-field sensing itself. For example, certain bioelectric measurements are typically made in clinical electrocardiograms (ECGs) and electroencephalograms (EEGs) by using Ag/AgCl electrodes attached to the skin that act as electromagnetic field transducers induced by the ionic current flow.

The basic mechanisms of the interaction of e-field sensors with an electromagnetic field can be reduced to redistribution of the electronic density of internal electric charges in a medium and to polarization features arising in the distribution of these charges. In its basic form, an e-field sensor senses the spatial gradient of electric potentials in a medium.

Maxwell's equations describe macroscopic electromagnetic phenomena reflecting the relations between the characteristic quantities of electromagnetic fields, the space- and time-dependent electric and magnetic field strength vectors E and H. In situations where e-field sensors are used, the wavelength of the electromagnetic field is usually large compared to the distance between the source and detector, and large compared to the size of the source and detector electrodes. In these cases, wave propagation phenomena may be neglected, i.e., either electric or magnetic fields can be regarded as static, even though the electric potential vary in time. Accordingly, electromagnetic waves that are produced by such time variances in the electric potentials can be effectively ignored.

These "slowly-varying" fields can be denoted as electro- and magneto-quasistatic, respectively. Electro-quasistatics (EQS) yield a reasonable approximation for slowly-varying fields that can be deemed free of eddy currents while the effects of the displacement current are dominant. This approximation is valid if the problem under study shows a capacitive behavior, i.e., an electrostatic field, for the idealized model of the static limit with frequency $f \to 0$. Another feature of the quasi-static nature of the electric potentials discussed herein is that the distance between the source and detector is generally significantly less than the ratio of the speed of light to the operating frequency, i.e., much less than the wavelengths corresponding to the maximum frequencies of the field.

When using dielectric materials, polarization features are generally critical. These polarization features typically arise because virtually all known natural substances and physical objects on the planet belong, when considering their electromagnetic properties, to the class of dielectrics. This class includes atmospheric, i.e., non-ionized, gases, liquids such as fresh and ocean water, solid bodies such as soil, grounds, and rocks, vegetation, artificial, i.e., manufactured, materials and buildings, as well as objects of an animate nature.

The polarization of a dielectric when an electric field is applied generally takes place not instantaneously but over a certain time that will be referred to herein as the relaxation time. The temporary character of the relaxation process is bound to the physicochemical properties and structure of the substance and is exhibited in studying frequency characteristics of electromagnetic properties, i.e., the so-called dispersive properties. The range of frequencies in which the expressed changes of dielectric properties of substances mostly take place will be referred to herein as the dispersion region.

As noted above, electro-quasistatics (EQS) will be deemed valid when the relation $\tau_d = \mu \sigma d^2 << \tau_r = \in/\sigma$ with diffusion time $\tau_d$, relaxation time $\tau_d$, permeability $\mu$, electrical conductivity $\sigma$, electrical permittivity $\in$ or dielectric constant, and a characteristic dimension d, is met. According to Maxwell's electromagnetic field theory, charge $q_s$ is accumulated at the interface between two dielectric materials with different relaxation times given by $\tau_r = \in/\sigma$ when current I(t) flows across the two-material interface. This follows from Ohm's Law, $\vec{J} = \sigma \vec{E}$, when ($\neq 0$, const.), because $\nabla \cdot \vec{J} = 0$ is satisfied when steady state current density $\vec{J}$ flows across the interface, where $\vec{J}$ is the current density vector and $\vec{E}$ is the electric field vector. Under this condition, the following relation concerning the electric flux density $\vec{D}$ may be naturally derived as shown in Equation 1:

$$\nabla \cdot \vec{D} = \nabla \cdot (\varepsilon \vec{E}) = \nabla \cdot \frac{\varepsilon}{\sigma} \vec{J} = q_s (\neq 0) \quad \text{(Eq. 1)}$$

This will be referred to herein as the so-called Maxwell-Wagner effect, and it indicates that charge $q_s$ is accumulated at the interface when the adjacent two materials have different relaxation times ($\tau_1 \neq \tau_2$). This theory provides the possibility that, as electromagnetic fields propagate through a dielectric medium, the charge $q_s$ will be accumulated at an interface between material 1 and material 2 so that the fields can be detected and amplified to useful levels.

As a practical mater, the electromagnetic field charge amplification effect tends to occur naturally in certain materials and devices such as an electric microphone. FIG. 1 illustrates a typical electric microphone preamp circuit 100 that uses a two-terminal electric capsule having an FET 102 in a common source configuration. In the example, the FET 102 is externally powered by a supply voltage V+ 104. A resistor 106 sets the gain and output impedance, and the audio signal appears at the output 110, after a DC-blocking capacitor 108. In a typical microphone circuit, shielding must be provided to guard against electromagnetic interference. In a microphone, the electric response tends to be undesirably affected by an electric field that is amplified by body capacitance when the microphone is brought close to a user's mouth. To overcome this effect, a microphone typically has a conductive film, which is transparent to acoustic waves, positioned between the passage and the ferroelectric element, such that the film contacts a grounded part of the casing. The conductive film can, and usually does, form an integral part of a microphone moisture barrier.

As noted above, virtually all known natural substances and physical objects are capable of dielectric polarization under an external electric field. Some materials, known as ferroelectric materials, demonstrate a pronounced nonlinear polarization. The electrical permittivity c, corresponding to the slope of the polarization curve, is a function of the external electric field. In addition to being nonlinear, ferroelectric materials tend to demonstrate a spontaneous polarization.

A typical ferroelectric material has two or more states with a non-zero polarization in the absence of an electric field and can be shifted from one to another of these states by the application of an electric field. This shifting mechanism can be maximized by using ferroelectric materials with a very high polarization charge. For example, barium strontium titanate (BST) is typically on the order of $\sim 10^{14}$ cm$^{-2}$. This charge may be developed during growth or induced by an external electric field. The Maxwell-Wagner relaxation and, therefore, charge accumulation is very large compared to other heterogeneous dielectrics.

Ferroelectric materials exist in various compositions and forms. Single crystals of a material simplify studies of fundamental ferroelectric phenomena. The crystallographic orientation can be well controlled and intrinsic properties can be more easily accessed. However, single crystals are not an option for many applications because their costs are too high. Ceramic materials can be processed, shaped, and manipulated more easily and, as a result, are preferred in many, e.g., piezoelectric, applications. The most widely used ferroelectric material, lead titanate zirconate (Pb(Zr,Ti)O3 (PZT)) cannot even be grown in single crystal form, at least not large enough to be useful in most if not all pertinent applications.

One of the most distinguishing features of ferroelectric materials or ferroelectrics is that the direction of the spontaneous polarization can be reversed by an applied electric field, which yields a hysteresis loop. Ferroelectric materials generally possess the ability to convert energy from one form to another. For example, ferroelectrics can change energy from mechanical form to electrical form via piezoelectricity or from heat energy, i.e., by way of a temperature change, into an electrical signal, i.e., pyroelectricity. Because of this property alone, ferroelectrics are commonly used for or in connection with various pressure and temperature transducers. In these devices, however, a ferroelectric material's sensitivity to electromagnetic fields tends to be a "defect" in the material in that something must be overcome for proper operation of the circuit.

The most likely opportunity exists in modifying the field effect transistor (FET). FETs are unipolar devices in which a current flow between two electrodes, called source and drain, is controlled by the potential on a third electrode called the gate. The electric current in the channel between source and drain is determined by the conductance of the channel, i.e., the concentration and mobility of free charge carriers. The concentration of these carriers in the channel is controlled by an electric field in FET, which penetrates into the semiconductor material.

The Maxwell-Wagner effect indicates that, as discussed above in the larger case $q_s$, charge $Q_s$ in an FET is accumulated at the interface when the adjacent two materials have the different relaxation times. In a typical FET, accumulated charge $Q_s$ will be conveyed along the channel when the external field is formed between source and drain electrodes with a spacing of channel length L by $V_{ds}$ ($=V_d$). Therefore, one may expect that current $I_{ds}$ ($=I_d$) is given by Equation 2:

$$I_{ds} = \frac{Q_s}{L} \mu \frac{V_{ds}}{L} \quad \text{(Eq. 2)}$$

$I_{ds}$ flows across the channel when the amount of charge $Q_s$ is continuously supplied to the interface without being trapped while the charge $Q_s$ is conveyed along the channel. The accumulated charge $Q_s$ is approximately given by Equation 3:

$$Q_s = -\left(\frac{\tau_1}{\tau_2} - 1\right) C_g LW\left(V_g - \frac{1}{2}V_{ds}\right) \tag{Eq. 3}$$

In the equation, $C_g = \epsilon_0 \epsilon_2 / d_2$ because the voltage difference across the gate insulator at x=0, i.e., at the source electrode is $V_g$, and at x=L, i.e., at the drain electrode, the voltage difference is $V_g - V_{ds}$. In the equation, $\tau_1$ and $\tau_2$ refer to the relaxation time of the Si and gate insulator, respectively, and $\epsilon_2$ and $d_2$ are dielectric constants of the gate insulator and the thickness, respectively. In the equation, L and W refer to the channel length and channel width, respectively.

A key factor that tends to limit the operating voltage in an FET and, therefore, the sensitivity of the e-field sensor, is a subthreshold swing S, which is the inverse of the change of current that can be obtained for a unit change in gate voltage, $V_g$. Conventional FETs generally require a change in the channel potential of at least 60 mV at 300° K to effect a change in the current by a factor of 10, and this minimum sub-threshold slope S puts a fundamental lower limit on the operating voltage and hence sensitivity in a standard FET-based transistor. This follow directly from Boltzmann's constant, hence the term "Boltzmann tyranny," where $\psi_s$ is the surface potential, as demonstrated by Equation 4:

$$S = \frac{\partial V_g}{\partial(\log_{10})I} = \frac{\partial V_g \partial \psi_s}{\partial \psi_s \partial(\log_{10})I} \tag{Eq. 4}$$

Standard FET analysis shows that the second term $\delta\psi s$ $\delta(\log_{10} I)$, which relates the change in the current to the change in the surface potential in the channel, cannot be any lower than 60 mV/decade at room temperature. Because Vg and $\psi_s$ are related by a capacitive voltage divider, as illustrated in FIG. 2, it is apparent that the first term $\delta V_g/\delta\psi_s$, which is often referred to as the body factor 'm' and given by $$\frac{\partial V_g}{\partial \psi_s} = 1 + \frac{C_s}{C_{in}} \tag{Eq. 5}$$

must exceed one, thereby putting a lower limit of 60 mV/decade, i.e., corresponding to m=1, on the subthreshold slope S. Even high-κ insulators with phenomenally large values of $C_{ins}$ can only reduce the body factor m so as to approach one, but cannot make it any smaller.

This lower limit of 60 mV/decade tends to be a serious limitation on the use of a traditional FET as an e-field detector. By replacing the conventional insulator in a FET with a ferroelectric insulator having a P-E (polarization versus electric field) characteristic of the type illustrated in FIG. 2, however, it is possible to obtain $\delta V_g/\delta\psi_s < 1$ and, consequently, a value of S lower than 60 mV/decade. FIG. 2(a) shows a stored charge Q with respect to an applied voltage $V_{ins}$ for a typical ferroelectric material. The dashed line shows the negative capacitance region ($C_{ins}<0$). FIG. 2(b) shows that dielectric insulators exhibit positive capacitance ($C_{ins}>0$) and that the surface potential (φs) follows the gate voltage ($V_g$) with a gain G≤1 (dashed line). Ferroelectric insulators operated in the negative capacitance region could result in surface potential amplification (G>1) (solid line). FIG. 2(c) shows a gain G=1, which is the maximum gain with a dielectric insulator, that results in a subthreshold slope S=60 mV/decade (dashed line). Replacing the insulator with a ferroelectric material operated in the negative capacitance region yields G>1 and S<60 mV/decade (solid line).

Figure 2:
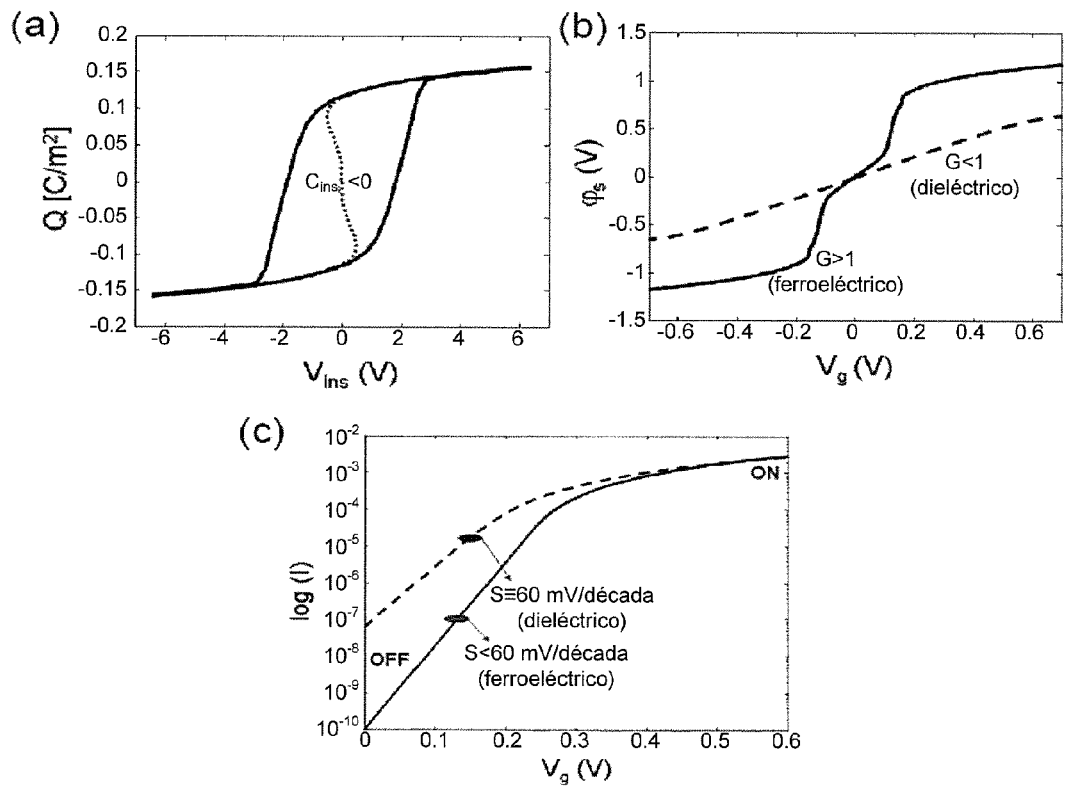
FIG. 2 includes three graphs that pertain to polarization versus electric field for a FET in which a conventional insulator is replaced with a ferroelectric insulator.

One having ordinary skill in the art will recognize from FIG. 2 that the ferroelectric capacitor is effectively a negative one, since the slope of P versus E, which is a scaled version of Q versus V, around the origin is negative. This negative slope segment would ordinarily be unstable and not directly observed in experiments that exhibit hysteretic jumps in the polarization, but if the ferroelectric capacitor is placed in series with a normal capacitor, the negative capacitance segment can be effectively stabilized, thereby making it possible for the channel potential $\psi_s$ on an internal node to change more than the voltage $V_g$ applied externally. As a result, this essentially provides a voltage amplifier that will be referred to herein as a step-up voltage transformer.

Replacing the electric gate in a field effect transistor with a ferroelectric material and directly exposing the ferroelectric gate to electromagnetic fields in order to sense these fields yields several advantages as noted above, such as combining the charge collector, charge amplifier, and integrate and dump circuits into a single structure. Ferroelectric materials have interesting and useful properties in analog circuits. Since ferroelectric transistors possess the properties of hysteresis and nonlinearity, for example, an analog amplifier containing a ferroelectric FET will have very different characteristics than one with a traditional FET.

Negative Capacitance from Positive Feedback

The negative capacitance in ferroelectric materials, referred to herein as ferroelectrics, can be understood in terms of a positive feedback. By applying a voltage to the ferroelectric layer, the polarization can be made to increase without limit until the lattice gets "locked in" with a high self-generated internal polarization. Consider a [positive] capacitor $C_0$ (per unit area) that sees a terminal voltage equal to the applied voltage V plus a feedback voltage $\alpha_f Q$ proportional to the charge on the capacitor Q (per unit area) as shown by Equation 6:

$$Q = C_0(V + \alpha_f Q) \tag{Eq. 6}$$

Equation 6 yields a Q Vins=C as shown by Equation 7:

$$C_{ins} = \frac{C_0}{1 - \alpha_f C_0} \tag{Eq. 7}$$

With $\alpha_f C_0 > 1$, a negative capacitance is formed that would ordinarily lead to an instability such that the charge would increase until limited by the non-linear terms neglected so far.

If the circuit is stabilized by putting a positive oxide capacitance Cs in series with the negative capacitor so that the overall capacitance $[C_s^{-1} + C_{ins}^{-1}]^{-1}$ is positive, however, then it follows from Equations 6 and 7 that the body factor m may be determined as shown by Equation 8:

$$m(V_G) = 1 - \frac{C_s}{C_{ins-eq}(V_G)}(\alpha_F C_{ins-eq}(V_G) - 1) \tag{Eq. 8}$$

where $$\frac{1}{C_{ins-eq}} = \frac{1}{C_{ox}} + \frac{1}{C_{ferro}}(V_G).$$

The negative capacitance can be used as a voltage transformer that steps up the applied potential of $V_g$ into a channel potential of $\psi_s$. So long as $C_{eq} = C_s^{-1} + C_{ins}^{-1}$ remains positive, the composite ferroelectric-semiconductor system tends to behave like a normal [positive] capacitor.

More generally, the linear capacitor may be replaced $Q=C_0$ ($V+\alpha_f C_0\ Q$) with a general nonlinear capacitance function $Q=F(V+\alpha_f Q)$, such that $$V=F^{-1}(Q)-\alpha_f Q \qquad \text{(Eq. 9)}$$

Noting that the function $F^{-1}$ is generally odd, it could be expanded approximately up to the fifth power, the first term being the inverse linear capacitance $1/C_0$, to yield Equation 10:

$$V \approx \alpha_0 Q + \beta_0 Q^3 + \gamma_0 Q^5 + \rho_0 \frac{dQ}{dt} \qquad \text{(Eq. 10)}$$

Equation 10 adds a possible resistive drop proportional to the current dQ/dt. One having ordinary skill in the art will note that the parameter $\alpha_0$ equals $(1/C_0)-\alpha_f$ and will be negative if in the negative capacitance regime where $\alpha_f C_0 > 1$.

Gain-Enhanced FETs (GE-FETs)

Certain implementations are directed to devices that include a gain-enhanced FET (GE-FET), such as an electromagnetic (EM) wave sensor that can sample an EM wave with minimal energy transfer from that wave over very broad bandwidths. These implementations can include modifying the gate structure of a traditional FET to include a polarizable element that that can act as a step-up charge "transformer" by taking advantage of the positive feedback created. The combination of the positive feedback and gate capacitance can be designed to create what looks like a negative capacitor. On the micro scale, this negative capacitance in series with a positive capacitor creates a nearly-frequency-independent effect that greatly increases the surface charge density at the FET channel junction. Because the FET channel characteristics are not changed, much higher currents are possible at lower EM field densities than can possibly be achieved with the conduction currents formed by a conventional antenna.

The physics behind this negative capacitance regime is associated with depolarizing field effects, i.e., the electric field that accompanies the polarization of the [finite-size] ferroelectric. As a result of this field, there is a shift in ferroelectric transition point and the ferroelectric can operate in its [otherwise unstable] paraelectric state. In such a state, the voltage drop $\Delta V$ through the ferroelectric may decrease responsive to increasing the gate voltage. This may yield the desired amplification because the changes in the surface potential $V_s$ are then larger than the ones in the gate. These techniques typically include controlling this polarization of the gate material in order to provide maximum amplification in the paraelectric phase and limit transition into the ferroelectric state. This may be accomplished by way of an additional gate or gates whose function is specific to controlling gate material polarization.

Ferroelectric materials or ferroelectrics have interesting characteristics such as the spontaneous polarization and consequent polarization hysteresis, as well as the transition to a nonpolar paraelectric phase at a transition temperature $T_{co}$. Some ferroelectrics are crystalline polymers with polar repeat units, such as the odd nylons and polyvinylidene fluoride (PVDF) and its copolymers, e.g., trifluoroethylene (TrFE). PVDF and its copolymers have been studied due to their pyroelectric and piezoelectric properties. The copolymer (PVDF-TrFE) has the simple linear structure $(CH_2-CF_2)-(CF_2-CHF)_{1-x}$ where the monomers are understood to have a random sequence.

The ferroelectric β phase of P(VDF-TrFE) consists of all-trans chains, which possess a net electric dipole moment perpendicular to the carbon backbone, directed from the electronegative fluorine toward the electropositive hydrogen. When P(VDF-TrFE) is heated through the ferroelectric-paraelectric phase transition, the all-trans chains develop a disordered trans-gauche conformation packed in a centrosymmetric hexagonal structure and a (110) lattice spacing that is typically about 10% larger than that of the ferroelectric β phase.

Figure 3:
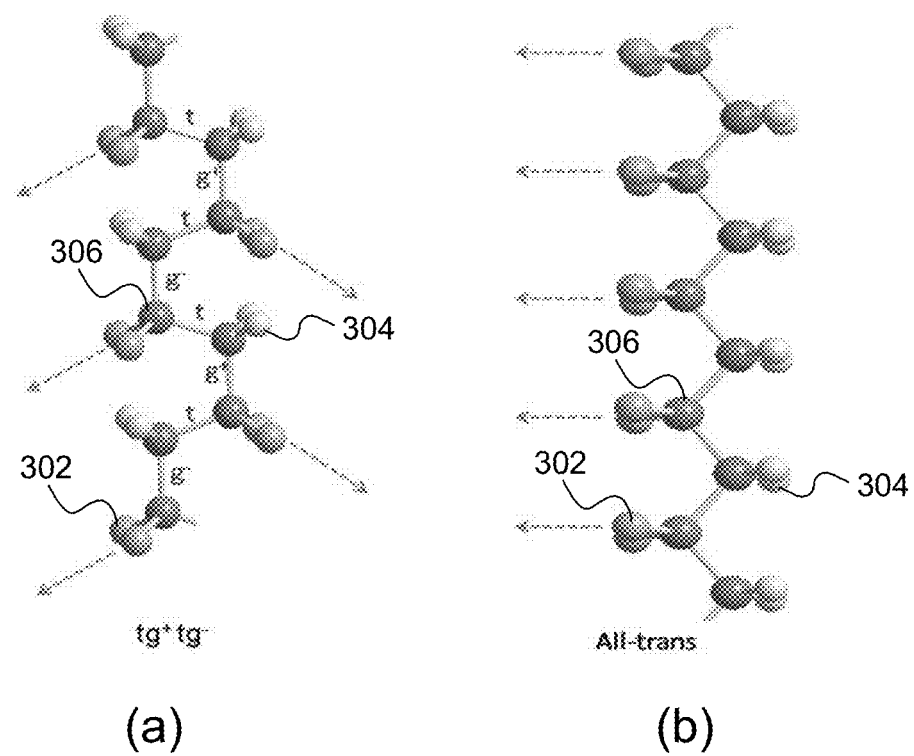
FIG. 3 is a schematic description of two common conformations of the ferroelectric polymer poly(vinylidene fluoride) (PVDF).

FIG. 3 is a schematic description of two most common conformations of PVDF. FIG. 3(a) shows the first conformation, which is $tg^+tg^-$. FIG. 3(b) shows the second conformation, which is all trans. Both conformations include fluorine atoms 302, hydrogen atoms 304, and carbon atoms 306. Application of hydrostatic pressure tends to increase the coercive field and transition temperature even to the point of converting the transition type from second order to first order in low-VDF content polymers. In certain embodiments, it is possible to convert the paraelectric phase to the ferroelectric phase through the application of an external electric field.

Figure 4:
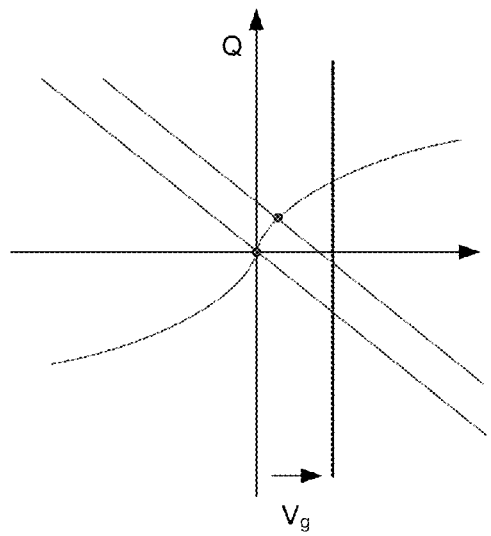
FIG. 4 illustrates a possible state in an FET gate and a geometrical determination of the bias point for the simple paraelectric state.
Figure 5:
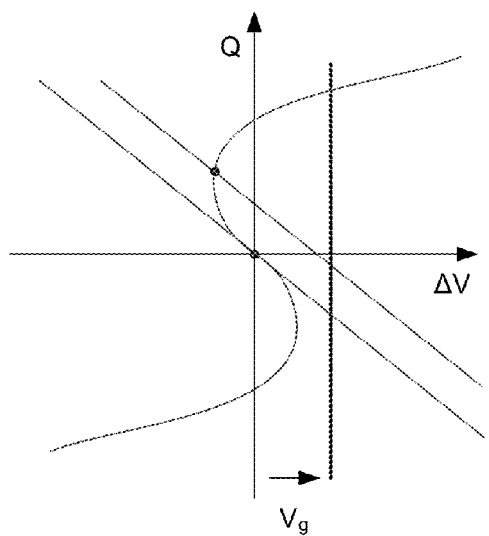
FIG. 5 illustrates a possible state in the FET gate and a geometrical determination of the bias point for a more complex paraelectric state.
Figure 6:
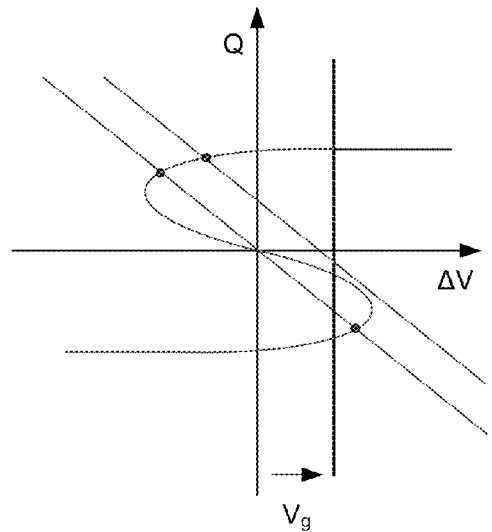
FIG. 6 illustrates a possible state in the FET gate and a geometrical determination of the bias point for the hysteretic ferroelectric state.

FIG. 4 illustrates a possible state in an FET gate and a geometrical determination of the bias point for the simple paraelectric state. FIG. 5 illustrates a possible state in the FET gate and a geometrical determination of the bias point for a more complex paraelectric state. In this state, the negative capacitance regime with the step-up conversion of the surface potential is achieved. FIG. 6 illustrates a possible state in the FET gate and a geometrical determination of the bias point for the hysteretic ferroelectric state.

FIG. 4 includes a plot of the load line $Q=C_s V_{surface}=C_s (V_{gate}-\Delta V)$, where Q and $C_s$ are the charge and the semiconductor capacitance, respectively, and the Q($\Delta V$) characteristic of the ferroelectric. The slope of this is always positive if the ferroelectric is well inside its paraelectric phase and, therefore, the intersection between this function and the load line shifts toward higher voltages if the gate voltage is increased. The ferroelectric then behaves as the conventional oxide in the FET.

When the ferroelectric Q($\Delta V$) characteristic acquires its S-shaped form as shown in FIG. 5, however, its slope is negative for $\Delta V=0$. This happens below the nominal transition temperature of the ferroelectric. When the slope is more negative than $-C_s$, the intersection with the load line shifts toward lower voltages as the gate voltage increases. This means that the surface potential is enhanced which can associated with a negative-capacitance behavior of the ferroelectric.

If the ferroelectric Q($\Delta V$) characteristic gets sufficiently flat for low voltages, then there are three points of intersection with the load line, as illustrated by FIG. 6, from which only the points marked with dots correspond to stable states for the ferroelectric. The voltage amplification holds until these points shift again toward higher values if the gate voltage is increased. This eventually translates into hysteresis loops for gate voltages varying cyclically from positive to negative.

In certain embodiments, the response of the FET to the applied voltage may be obtained by following the Landautype approach. For example, the behavior of the ferroelectric may described by Equations 11 and 12:

$$aP+bP^3-c\nabla^2 P = -\delta_z V \quad \text{(Eq. 11)}$$

$$[\in_{effective}(\delta_x^2 \delta_y^2)]V - \delta_z P = 0 \quad \text{(Eq. 12)}$$

Here, P represents the distribution of polarization along the ferroelectric z-axis and V represents the electrostatic potential in the ferroelectric. Equation 11, which can be derived from a Ginzburg-Landau-Devonshire free energy theory, represents the constitutive equation for the ferroelectric whose electrostatics, as follows from Maxwell's equations, is eventually determined by Equation 12. The instability that generally gives rise to ferroelectricity is described by the vanishing of the coefficient $a=a'(T-T_{C0})$, where $T_{C0}$ represents the transition temperature in the absence of a depolarizing field while the rest of coefficients are assumed to be positive constants. A second-order (continuous) phase transition, which is typically favorable for the amplification of the FET gate voltage, is assumed.

If the semiconductor is assumed to be undoped or lightly doped and operating within its subthreshold regime, its mobile carrier density may be neglected, which leaves the equation $\nabla^2 V_s = 0$ for the electrostatic potential in the semiconductor.

At the ferroelectric-semiconductor interface, these quantities generally need to satisfy the electrostatic matching conditions $V=V_s$ and $\in_0 \delta_z V - P = \in_s \delta_z V_s$, where $\in_s$ represents the dielectric constant of the semiconductor. In addition, we have the boundary conditions $V=V_g$ at the gate and $V_s=0$ in the semiconductor beyond its depletion layer. $V_g$ is assumed to be below the FET threshold voltage in the following equations.

So long as the ferroelectric stays in its paraelectric phase, the body factor m of the FET may be given by Equation 13:

$$m = 1 + \frac{\varepsilon_s}{1+\varepsilon_0 a w} \frac{l}{w} a \quad \text{(Eq. 13)}$$

Here, l and w represent the thickness of the ferroelectric and the width of the semiconductor depletion layer, respectively. Noting that $\in_0 |a|=1$ in the vicinity of the ferroelectric instability, the result is determined by Equation 14:

$$m:1+\varepsilon_s \frac{al}{w} = 1 + \frac{C_s}{C_{ferro}} \quad \text{(Eq. 14)}$$

where $C_s = \in_s/w$ and $C_{ferro} = 1/al$. The desired step-up transformer action of the surface potential may be obtained if the body factor is m<1. This is generally possible if the bare polarization stiffness a gets negative such that the ferroelectric can act as a negative capacitance $C_{ferro} < 0$.

Equation 13 for the body factor is typically valid so long as the ferroelectric stays in its paraelectric phase, i.e., for $a \geq a_c$. To obtain the corresponding expression for $a \geq a_c$ it is generally important to take into account that there is a non-zero background polarization in the ferroelectric. Close to the transition point, such a polarization is well described by the polarization wave $P_0$. In addition, the body factor typically increases once the ferroelectric enters its multi-domain ferroelectric phase so that the amplification effect decreases. This "hardening" results from the cubic $P^3$ term that eventually stabilizes the system. Nevertheless, the ferroelectric generally stays in the negative capacitance regime for some range of temperatures below the transition point.

Examples of FETs in Accordance with Embodiments of the Disclosed Technology

FIGS. 7-9 illustrate three different examples of FETs. FIG. 7 illustrates a conventional FET 700 having a source 702, an insulator 704, and a drain 706, as well as a source electrode 708, a gate electrode 710, and a drain electrode 712. FIG. 8 illustrates a Salvatore-Inoescu FET 800 that is similar to the conventional FET 700 except for a PVDF layer 802 under the gate electrode 804. To take advantage of the "step-up voltage transformer" effect created by a negative-positive capacitor combination, the ferroelectric region must be set or "pre-charged" into the negatively polarized state. In a typical circuit it is not possible to use the same gate as both a pre-charge element and a construct of the e-field sensor. Accordingly, FIG. 9 illustrates a modified FET 900 in which a second gate electrode 904 is added to the structure, which has first gate electrodes 902.

The second gate 904 is designed to allow an external circuit to set and reset the polarization. The primary gate 902 may be left floating in order to detect e-fields directly where the charge on the gate electrode 902 is a Maxwell-Wagner element or may be a membrane where the charge on the gate electrode 902 is applied by a chemical process as in a Chem-FET, which is discussed in greater detail below.

Figure 10:
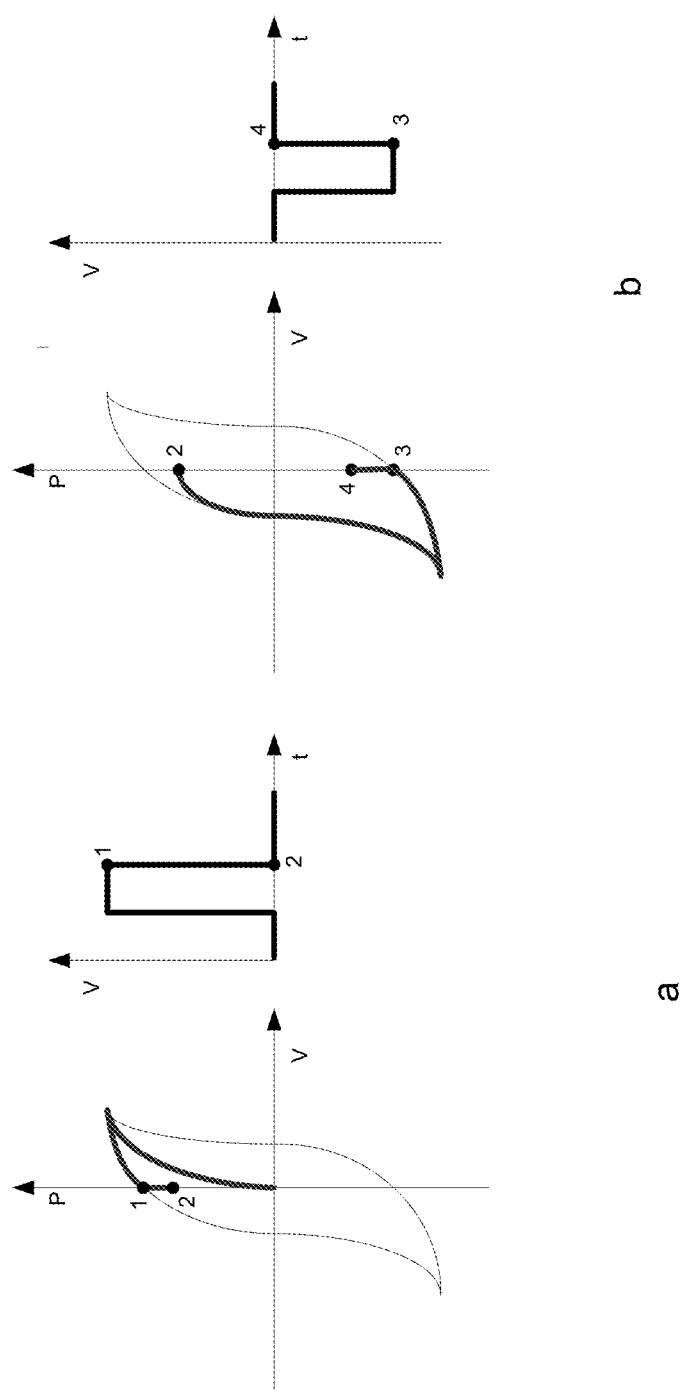
FIG. 10 shows a polarization curve and voltage pulse for a typical ferroelectric.

The hysteresis curve for polarization and, therefore, the capacitance of the ferroelectric, does not typically become zero once the charge voltage is removed, which allows its use as a memory element. FIG. 10 illustrates an example of the "memory effect" of the polarization of the ferroelectric. FIG. 10 shows a polarization curve and voltage pulse for a typical ferrorelectric. In FIG. 10(a), point 1 shows the effect of a positive voltage pulse being applied in that the polarization has relaxed to its maximum zero charge state. Point 2 shows that the voltage is now zero and the material is relaxed to its steady state positive polarization and, consequently, has a positive capacitance. In FIG. 10(b), point 3 shows that a negative voltage pulse has been applied and, consequently, the polarization has relaxed to its maximum zero charge state. At point 4, the voltage is now zero and the material is relaxed to its steady state negative polarization and, accordingly, has a negative capacitance.

Figure 11:
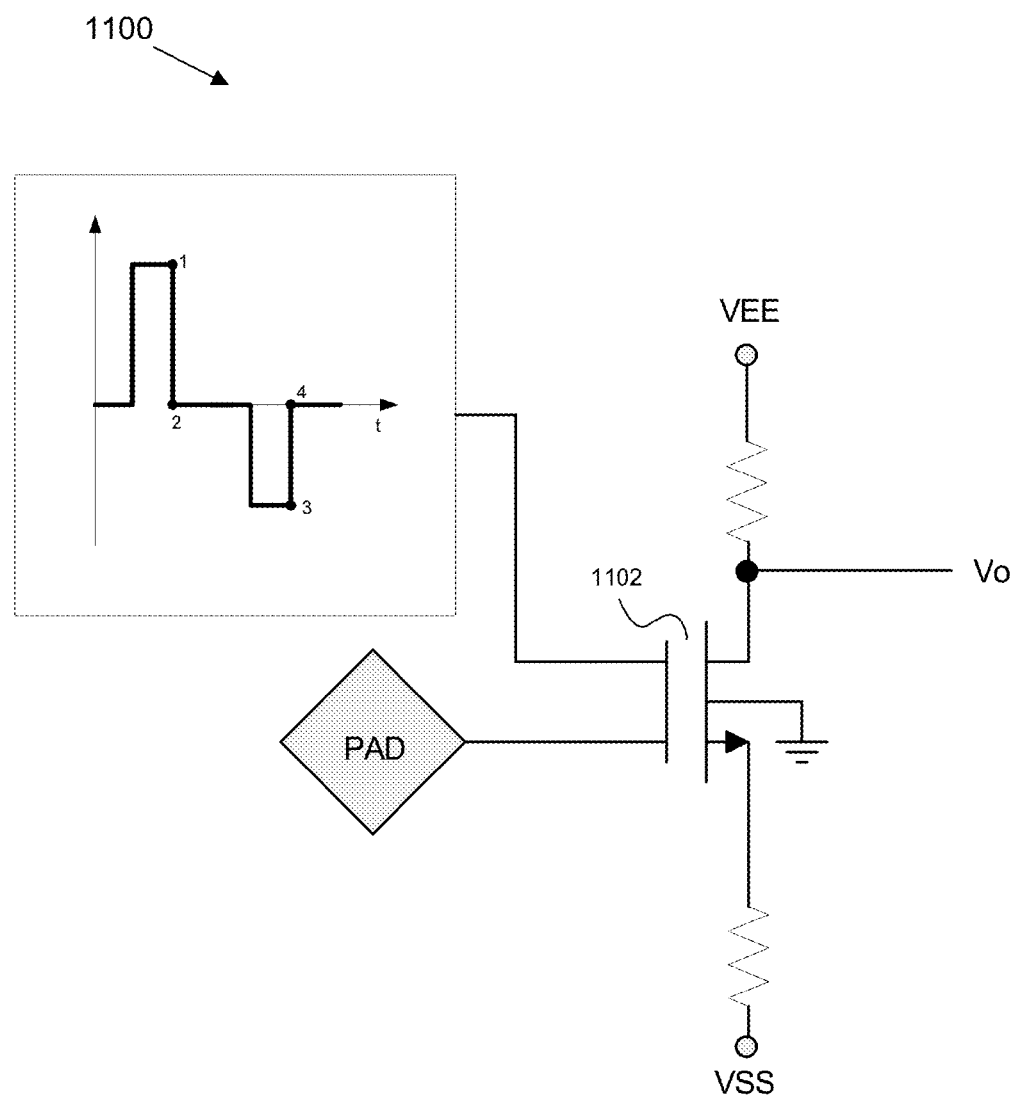
FIG. 11 illustrates a circuit that has a dual gate gain-enhanced FET (GE-FET) with a pre-charge circuit and floating gate.
Figure 12:
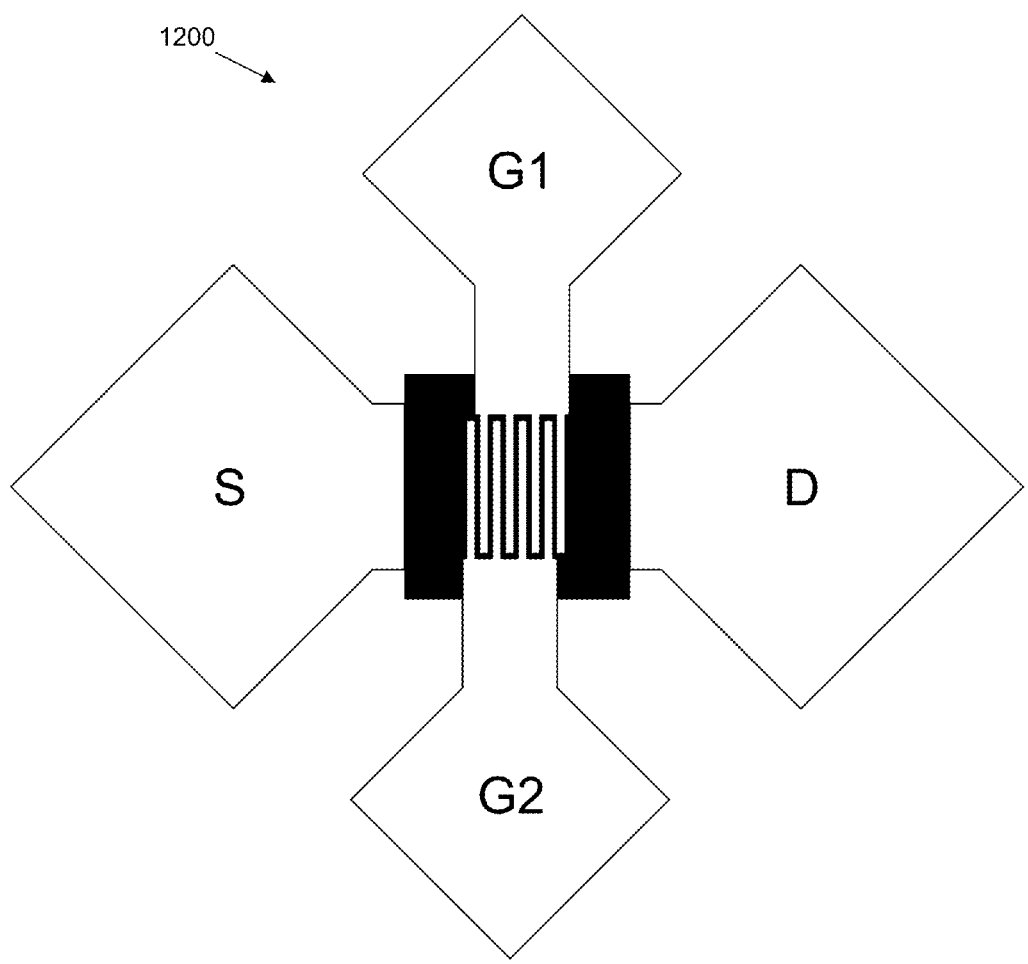
FIG. 12 shows a physical realization of the dual gate GE-FET illustrated in FIG. 10.

FIG. 11 illustrates a circuit 1100 having a dual gate GE-FET 1102 with a pre-charge circuit and floating gate. FIG. 12 illustrates a physical realization 1200 of the dual gate GE-FET 1102 of FIG. 11. The circuit 1100 of FIG. 11 suffers from unwanted sensitively in the ferroelectric material itself. Also, increasing the subthreshold swing reduces the ability of the circuit 1100 to be used in the linear or Ohmic region. As noted above, the unwanted sensitivity is typically due to the piezoelectricity and, therefore, microphonics and piezoelectricity-associated temperature effects of the ferroelectric material itself. These problems can be overcome, however, using two transistors in a differential pair in order to remove common mode effects, as illustrated in FIG. 13.

Figure 13:
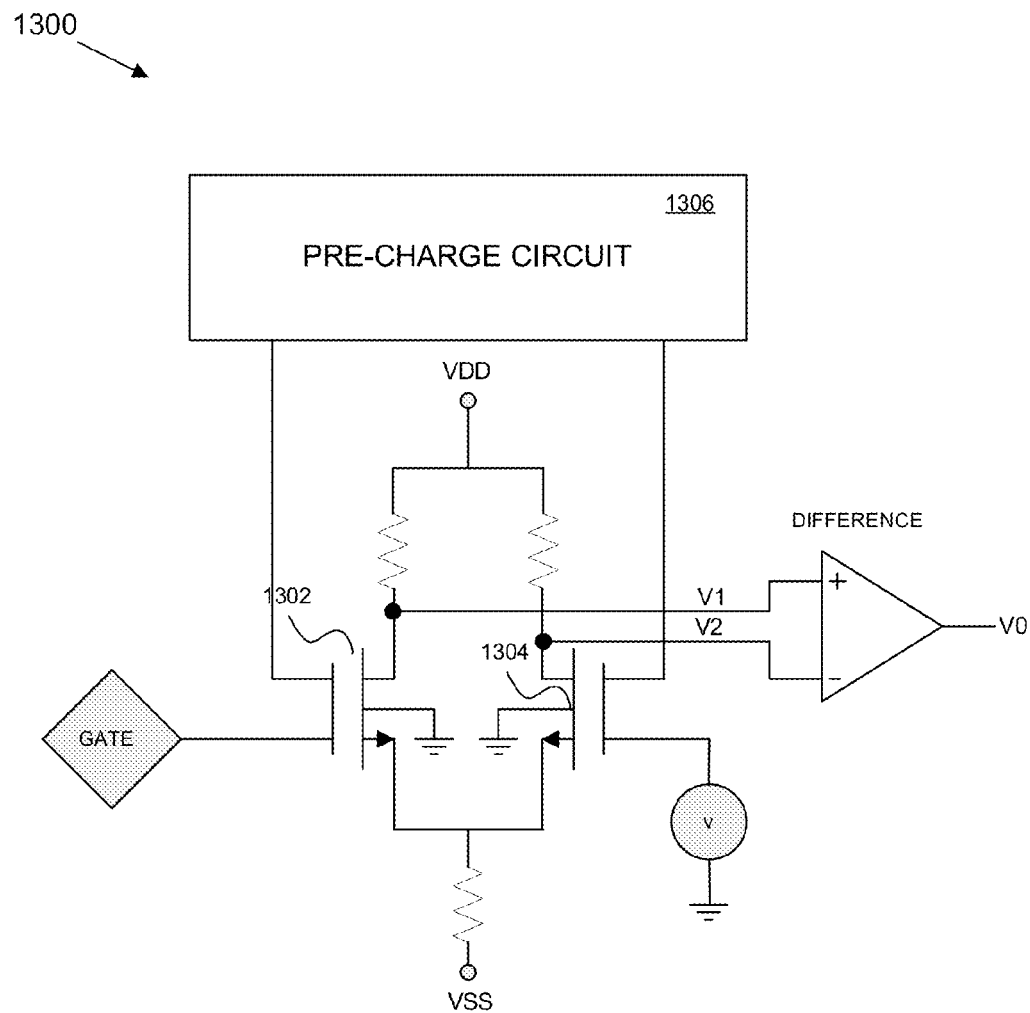
FIG. 13 illustrates an example of a circuit having two transistors in accordance with certain embodiments of the disclosed technology.

FIG. 13 illustrates a circuit 1300 in which two transistors 1302 and 1304 are polarized and depolarized equally but only one transistor is exposed to the element to be sensed. Because the transistors 1302 and 1304 are made at the same time on the same substrate, the common mode disturbances can be removed by a differential technique. In addition, the threshold voltages of the two devices are very nearly equal. The reduction of the linear region will effectively eliminate the use of this device in a linear mode. However, if each transistor is configured and driven by the pre-charge circuit 1306, a very efficient dual-slope analog-to-digital converter may be formed.

Figure 14:
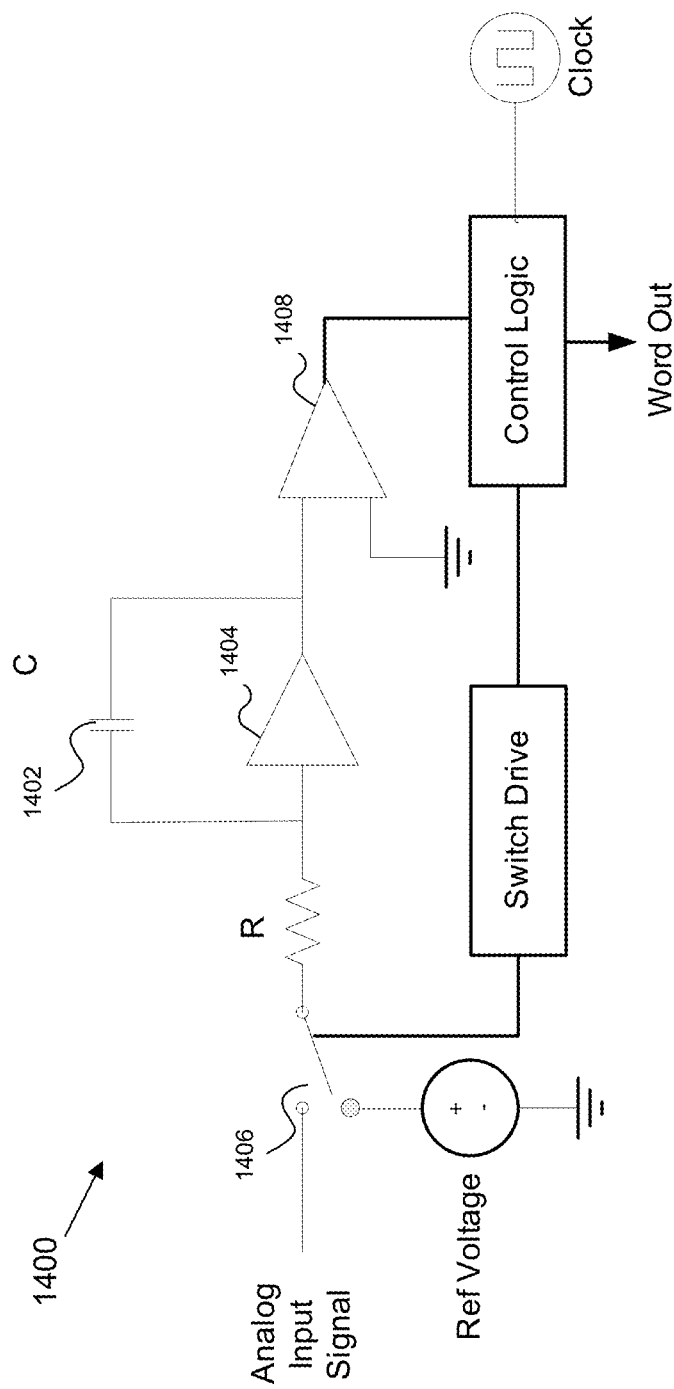
FIG. 14 illustrates an example of a conventional dual-slope analog-to-digital converter (ADC).

FIG. 14 illustrates a conventional dual-slope analog-to-digital converter (ADC) 1400 that operates by charging a capacitor 1402 from the input voltage during a fixed time, and then discharging the capacitor 1402 to zero. Data conversion can be accomplished in two phases: during input signal integration and during reference voltage de-integration. The integrator 1404 output is initialized to 0V prior to the start of integration and, during integration, an analog switch 1406 connects the analog signal input $V_{IN}$ to the integrator 1404 input, where it is maintained for a fixed time period, i.e., $t_{INT}$.

The application of $V_{IN}$ causes the integrator 1404 output to depart 0V at a rate determined by the magnitude of $V_{IN}$, and a direction determined by the polarity of $V_{IN}$. The de-integration phase is initiated immediately at the expiration of $t_{INT}$. During de-integration, the switch 1406 connects a reference voltage (having a polarity opposite that of $V_{IN}$) to the integrator 1404 input. At the same time, an external precision timer is started. The de-integration phase is maintained until the comparator 1408 output changes states and, at that point in time, the integrator 1404 has returned to its starting point of 0V. When this occurs, the precision timer is stopped. The de-integration time period ($t_{DEINT}$), as measured by the precision timer, is directly proportional to the magnitude of the applied input voltage.

Figure 15:
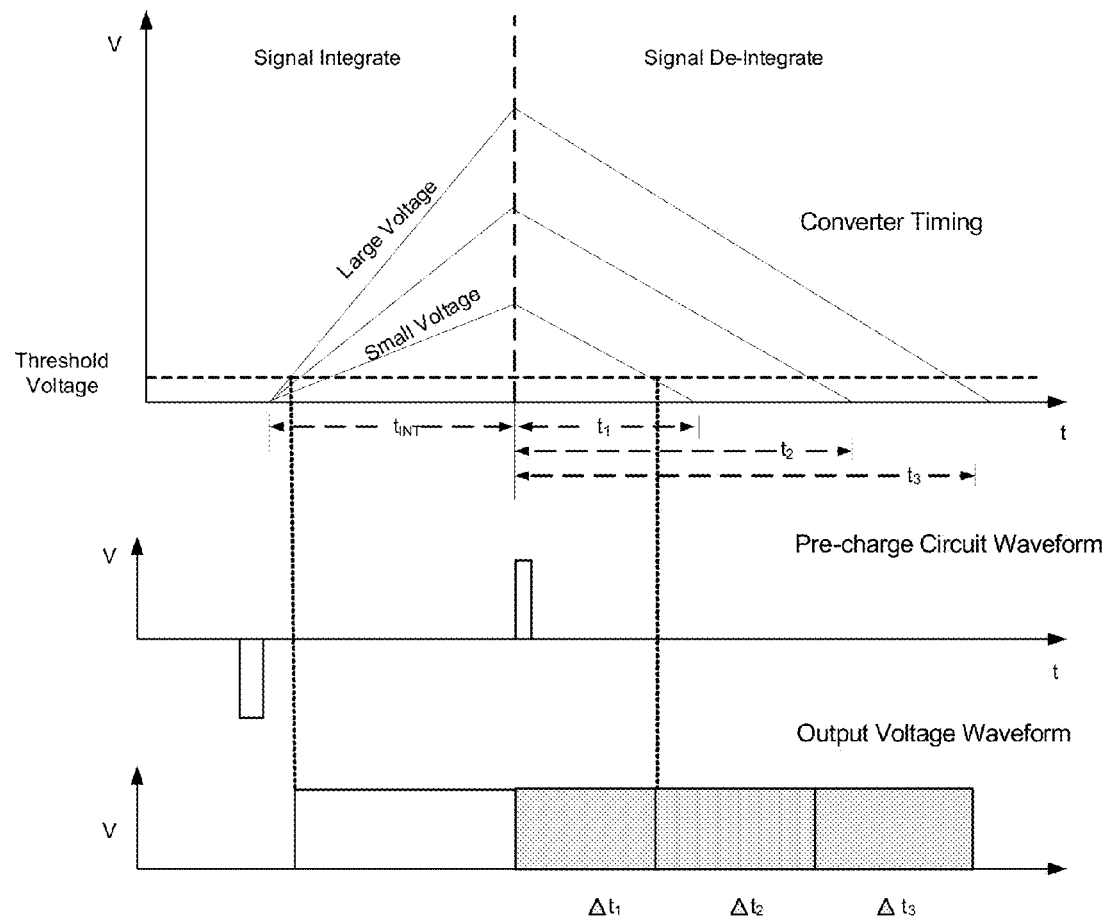
FIG. 15 illustrates an example of a timing diagram for a dual-slope ADC in accordance with certain embodiments of the disclosed technology.

FIG. 15 illustrates an example of a timing diagram for a dual-slope ADC such as the dual-slope ADC 1400 illustrated in FIG. 14. Equation 15 relates the input signal, reference voltage, and integration time as follows:

$$V = \frac{1}{R_{INT}C_{INT}} \int_0^{t_{INT}} V_{IN}(t)dt \quad \text{(Eq. 15)}$$

for a constant $V_{IN}$:

$$V_{IN}=V_{REF}(t_{DEINT}/t_{INT}) \quad \text{(Eq. 16)}$$

In the example, the dual-slope converter accuracy is unrelated to the integrating resistor and capacitor values as long as they are stable during a measurement cycle.

Integrating converters tend to provide inherent noise rejection, with at least a 20 dB/decade attenuation rate. Interference signals with frequencies at integral multiples of the integration period are, theoretically, completely removed since the average value of a sine wave of frequency (1/t) averaged over a period (t) is zero.

Implementations of the GE-FET described herein may use the positive feedback mechanism in the ferroelectric/insulator junction to create a negative capacitance C− in series with a positive capacitance C+ to form the step-up transformer. Therefore, two sub-threshold slopes are created, one with C− in series with C+ for charge collection, see, e.g., FIG. 10(b), and one with +(C−) in series with C+ for charge resetting, see, e.g., FIG. 10(a).

Figure 16:
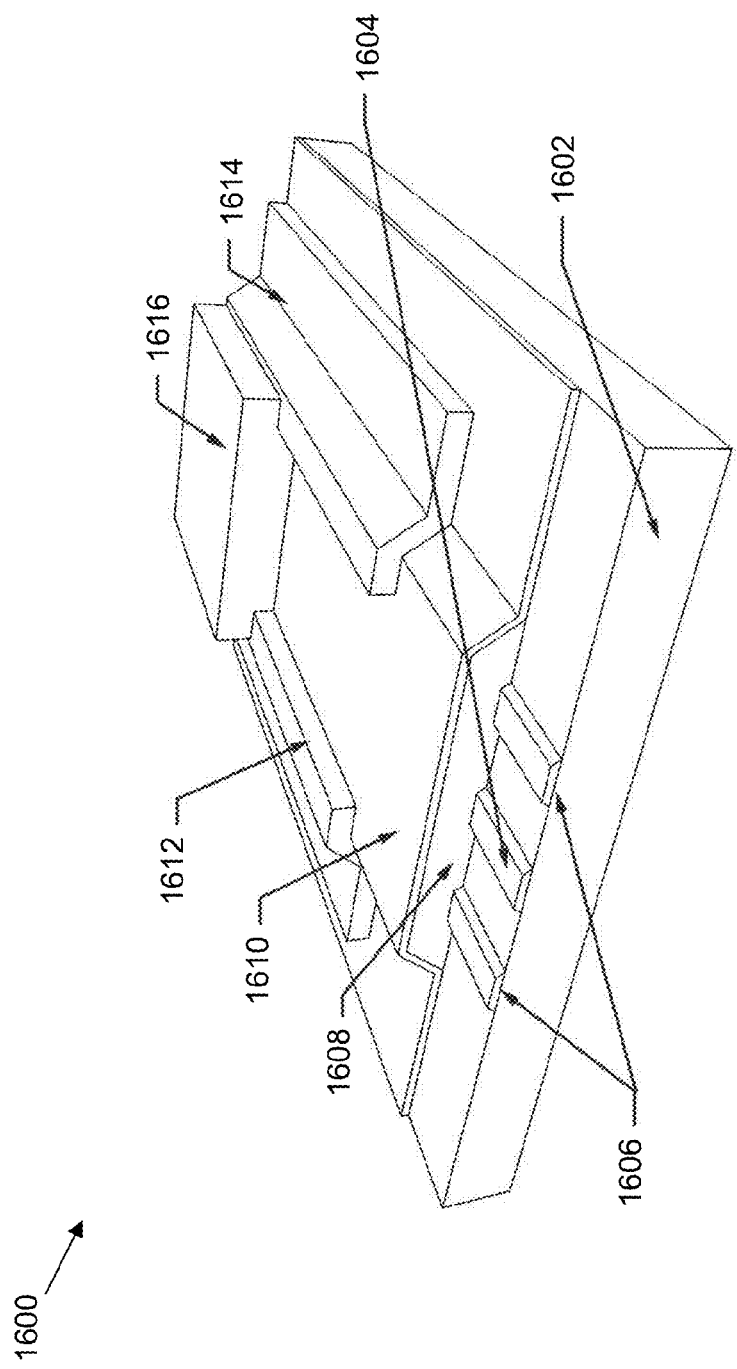
FIG. 16 illustrates an example of an organic GE-FET in accordance with certain embodiments of the disclosed technology.

FIG. 16 illustrates an example of an organic GE-FET 1600 that has a film 1602, a first gate 1604 and second gates 1606 formed on the film 1602, a PVDF layer 1608 formed over the gates 1604 and 1606, an insulator 1610 covering the PVDF 1608, a source 1612 and a drain 1614 formed on the insulator 1610, and a Pentacene layer 1616. It should be noted that certain implementations do not include the insulator 1610.

By substituting the GE-FET for the integrator, comparator, and reference voltage in FIG. 16, and the pre-charge circuit for the control logic, a new converter may be obtained. If the sub-threshold slope during C− series and C+ for the charge collection phase is denoted by $S_1$, then:

$$V_{up} = \frac{1}{S_1} \int_0^{t_{INT}} (V_{IN} - V_{TH})(t)dt \quad \text{(Eq. 17)}$$

and $S_2$ is the slope when +(C−) is in series with C+:

$$V_{down} = \frac{1}{S_2} \int_{t_{INT}}^{t_n} (V_{TH} - V_{IN})(t)dt \quad \text{(Eq. 18)}$$

for a constant $V_{IN}$ $$V_{IN}=V_{TH}(t_n/t_{INT}) \quad \text{(Eq. 19)}$$

Accordingly, the output clock count $\Delta t_n$ produced is directly proportional to the digitized value of the input voltage.

From the Nyquist-Shannon sampling theorem, any signal that is modulated at a frequency at one-half or less of the sampling frequency will be effectively detected. In this circuit, the frequency of the sampling system and pre-charge circuit/synchronous integrate-and-dump will be much greater than the signals that are of interest. By applying these techniques, an analog value of the signal may be represented as a digital stream, where logic high represents a value that is above the integrated threshold voltage and logic 0 represents a value that is less than the integrated threshold voltage. Density, as used herein, is defined as a percentage of the waveform that is above the integrated threshold voltage. The density is noted regardless of the actual waveform.

There are two properties of this converter that make it peculiarly suitable for applications of interest. The first is the integrating property and the second is the equal-interval property. The integrating property distinguishes the dual-slope from successive approximation converters which digitize a "spot" value. The input is generally integrated over a fixed time period, i.e., N clock cycles. This means the converter effectively integrates for a fixed time period and then measures the result. This property can be turned to great advantage when measuring voltages that are fluctuating at a known precise frequency by making the first integration period an integer number of cycles long, e.g., if the input is d.c.+60 Hz ripple, then a first integration time of 1/60 S, or any multiple thereof, will cause a true average to be taken because the component at 60 Hz will generally average to zero in 1/60 S. Voltmeters tend to use this principle to eliminate line "hum," i.e., 60 Hz, from their measurements. In physical experimentation, the property may be turned to advantage as a "filter" to eliminate unwanted problems.

Consider the output of the integrator at the end of the cycle as the comparator is about to change state: the slope of the integrator ramp-down is independent of the input and the analog circuit is unaware of the current count value. Therefore, every count looks like every other count and they are essentially indistinguishable from each other. It follows that the input voltage change required to go from count 1006101 should be the same as that for 100061001. This is in contrast to successive approximation analog-to-digital converters (ADCs) where some states may be wider than others due to resistor tolerancing, i.e., the equivalent of DNL in a digital-to-analog converter (DAC). The equal interval property is equivalent to a DNL of zero.

Electronic devices made of organic materials open a wide field for low cost and large area applications. GE-FET-based e-field sensors in accordance with the disclosed technology have various advantageous characteristics such as mechanical flexibility and lightweightedness. As noted above, the sub-threshold voltage slope of a field effect transistor is typically positively affected when a ferroelectric polymer is used in addition to the gate insulator. Certain implementations may integrate easily into an existing production line using organic transistors and may include the ferroelectric polymer poly (vinylidene fluoride) (PVDF) or its copolymer with trifluoroethylene (PVDF-TrFE). PVDF-TrFE is soluble in nontoxic reagents and can be spincasted into films of about 50 nm in thickness. The sub-threshold sensitivity enhancement using the dual gate technique described herein may significantly improve the high operational voltage of organic transistors.

The transistor element shown in FIG. 16 may be constructed by evaporating gold as a metal gate contact on a flexible plastic film. A spin-coated film of PVDF-TrFE used as the negative capacitor in a thickness of 2 μm, a relatively thick layer, annealed and polarized followed by additional spin-coated organic gate isolation consisting of 40 nm PVDF-TrFE forms the negative-positive capacitance layer. PVDF-TrFE in a molar ratio of 75/25 is usable for ink jet printing. Conductive "inks" may be used to form both source and drain electrodes using either spin-coating or ink jet printing followed by Pentacene as an active layer using a similar technique.

Figure 17:
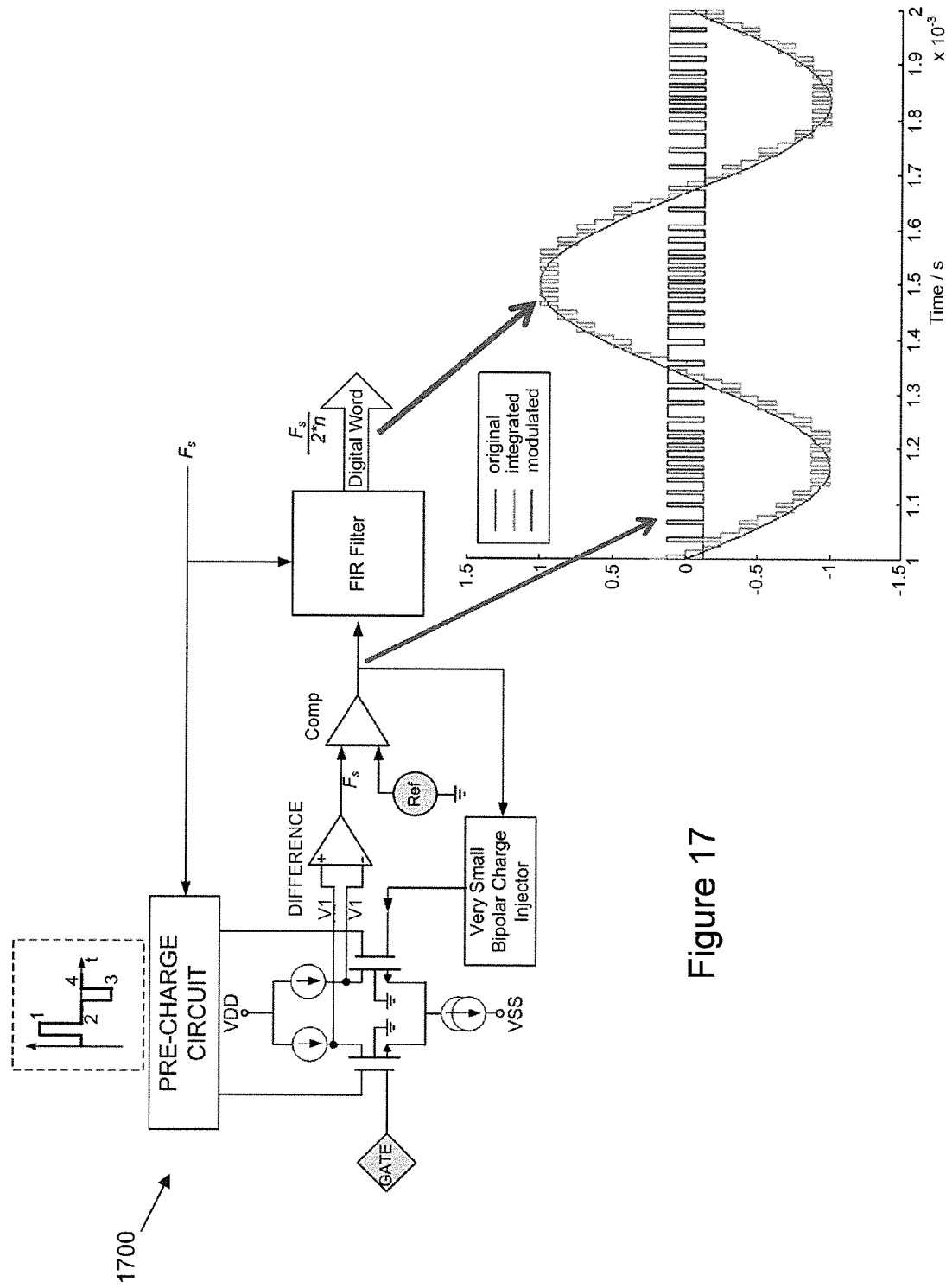
FIG. 17 is a schematic diagram for a GE-FET sigma-delta data converter in accordance with certain embodiments of the disclosed technology.
Figure 18:
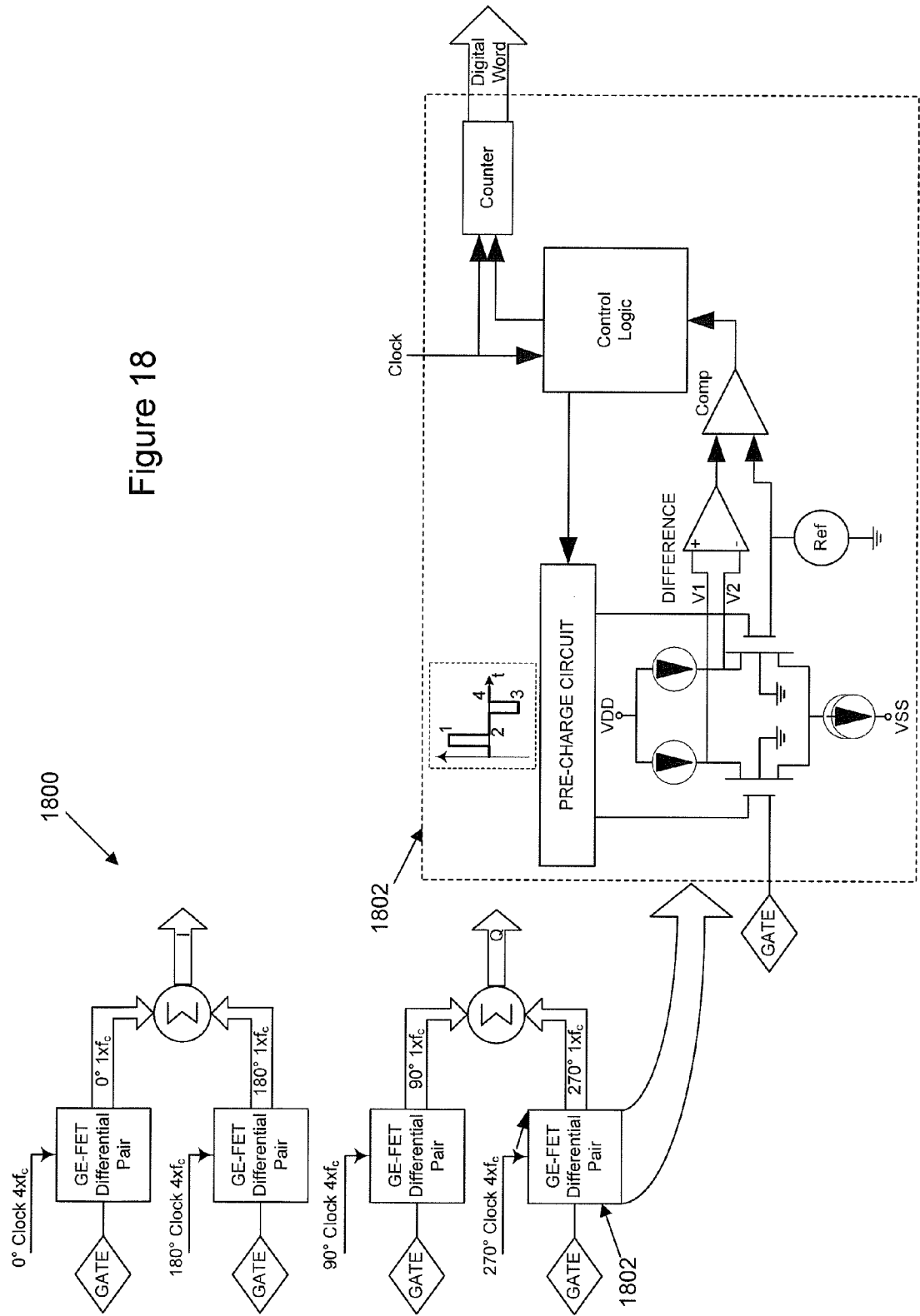
FIG. 18 is a schematic diagram for a GE-FET-based dual slope analog-to-digital converter in a synchronous demodulator in accordance with certain embodiments of the disclosed technology.
Figure 19:
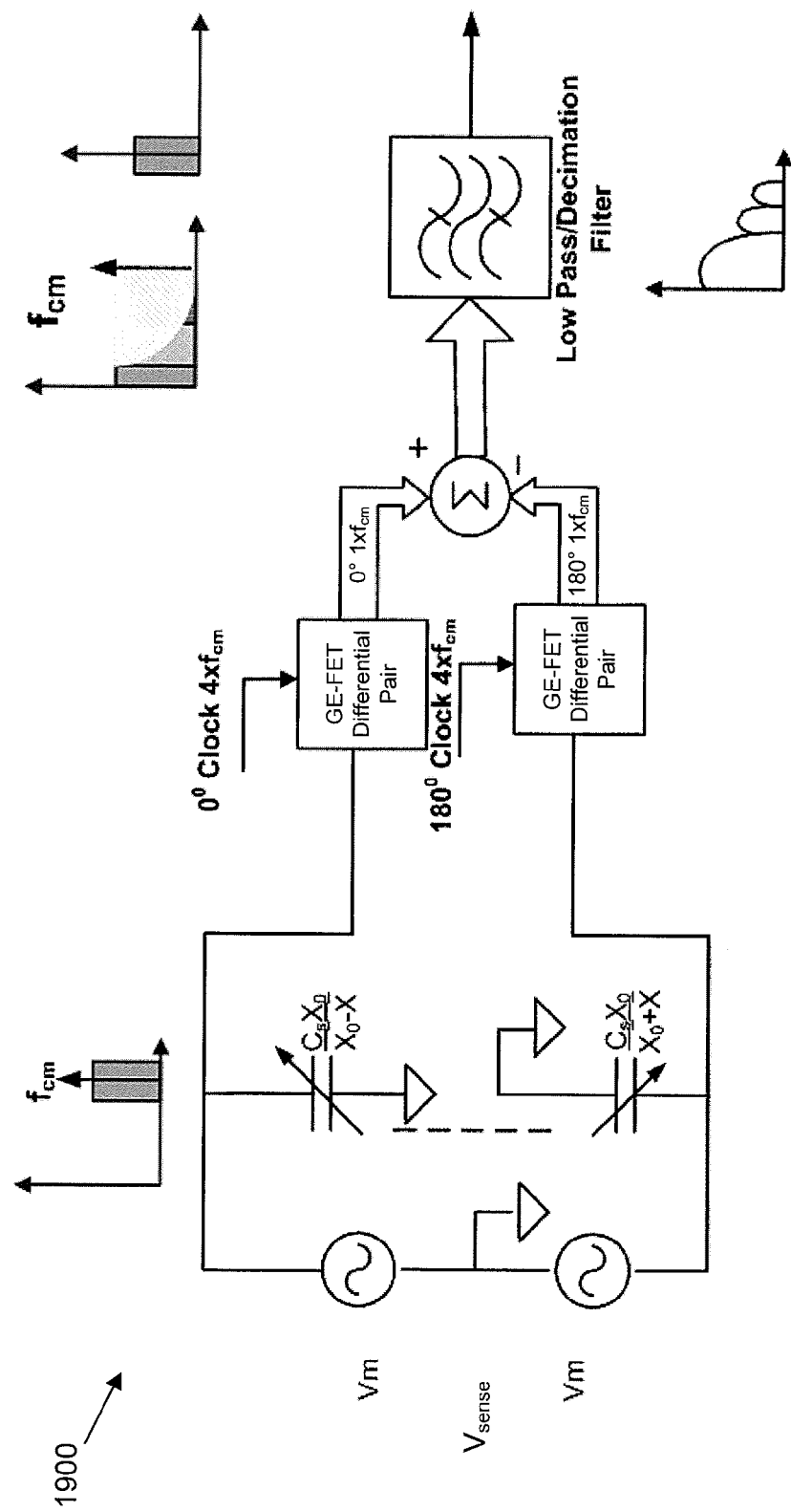
FIG. 19 is a schematic diagram for a GE-FET capacitance sensor.

FIGS. 17-19 illustrate different examples of devices that may include one or more GE-FETs. FIG. 17 is a schematic diagram for a GE-FET sigma-delta data converter 1700 in accordance with the disclosed technology. FIG. 18 is a schematic diagram for a GE-FET-based dual slope analog-to-digital converter 1802 in a synchronous demodulator 1800 in accordance with the disclosed technology. FIG. 19 is a schematic diagram for a GE-FET capacitance sensor 1900 in accordance with the disclosed technology.

ChemGE-FETs

A relatively new category of microfabricated chemical sensors such as chemiresistors and chemical field effect transistor (ChemFETs) have been developed. Conducting polymer FETs, which employ either a conducting polymer gate or a conducting polymer channel, have unique electronic properties. The major types of devices in the ChemFET family are the ion selective FET (ISFET), the enzyme FET (ENFET), and the basic ChemFET. Each of these devices uses mechanisms similar to those described herein with respect to the e-field sensor embodiments. In order to form a ChemFET, however, a chemically sensitive polymer typically replaces the gate metal as the gate electrode while retaining the film of P(VDF-TrFE) used as the negative capacitor and gate isolation in order to form the negative-positive capacitance layer. The second pre-charge gate is retained, which results in a ChemGE-FET.

ChemGE-FET-supporting electronics are generally simple and may be accommodated on the same substrate as the sensors themselves without appreciably increasing the overall size of the sensing system. Implementations involving a ChemGE-FET may result in compact, inexpensive sensors that can be deployed in the field for real-time detection of various analytes.

The effectiveness of any microfabricated chemical sensor is typically determined by three factors: sensitivity, selectivity, and robustness. Sensitivity is a measure of the lowest level of chemical concentration that can be detected in the sensing environment. In applications, it is usually desirable to know whether certain species of interest has exceeded a safe concentration limit. It is generally desirable to have a high selectivity for a chemical sensor. Selectivity refers to a measure of the ability to detect a given analyte in the presence of many contaminate species. Thus, a chemical sensing system may be designed with various types of sensors each with a high degree of selectivity to a known contaminate. In chemical sensing applications, selectivity is often tailored and adjusted to the analyte(s) of interest. In addition, a microfabricated sensor should generally exhibit a high degree of robustness in the environment in which it is deployed. Specifically, the sensor should maintain stable, predictable characteristics in the presence of a harsh environment.

The application of a negative-positive capacitance layer along with a pre-charge gate will typically result in orders of magnitude of increased sensitivities without compromising selectivity or robustness in the ChemGE-FET.

Antennas

To date, conventional antennas are based on one of the two Foster canonical forms and these devices, particularly electrically small antennas, suffer from problems created by these circuit forms. This is because, as passive devices, radio antennas generally derive all of their energy from the impinging EM wave. This typically must occur as the radio receive process requires the conversion of EM field energy into a conduction current for a given load impedance before further amplification.

The natural impedance of a typical antenna virtually never matches the load impedance so matching networks must be used to maximize energy transfer into the rest of the system. Unfortunately, all of the real components in these matching networks are usually lossy and frequency dependent, making these matching networks an engineering compromise for a given operating point. It is for this reason that wideband performance is always subject to compromise.

Figure 20:
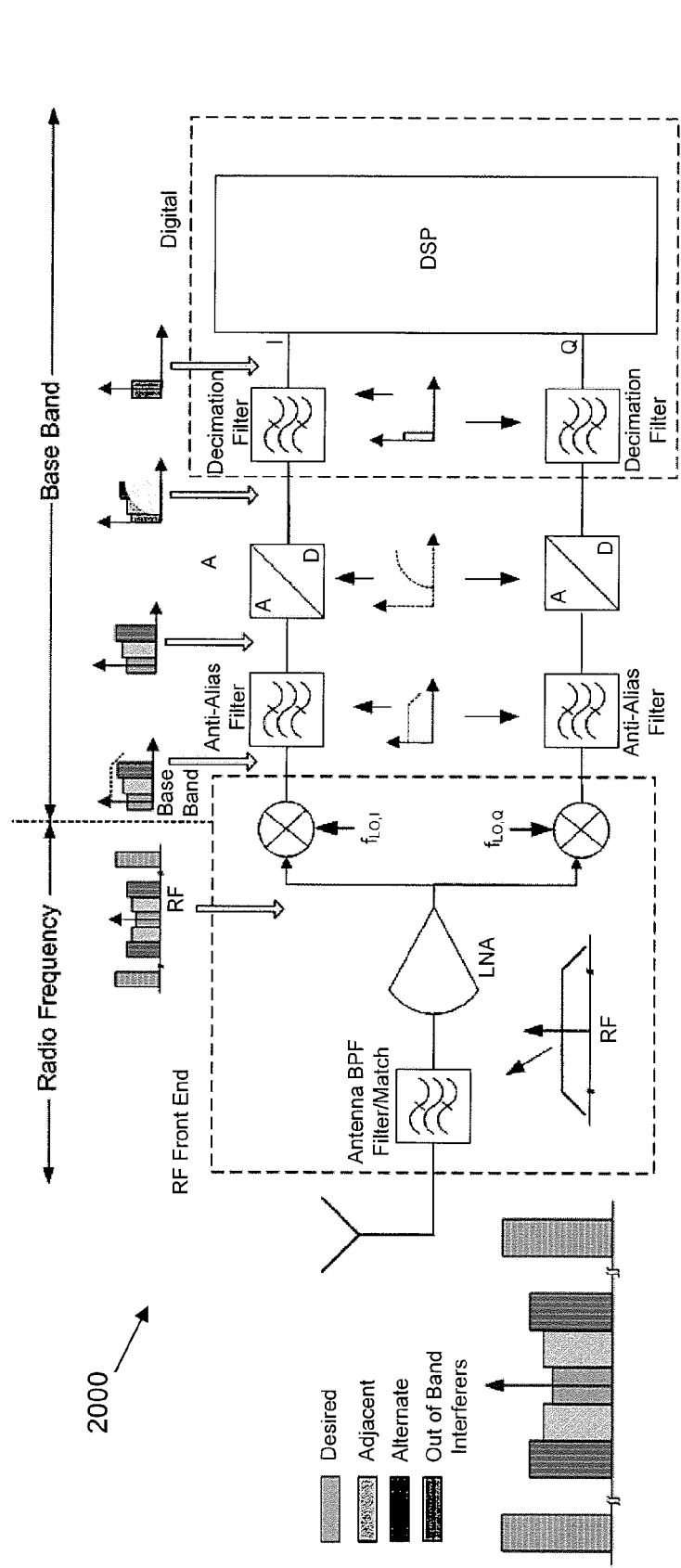
FIG. 20 illustrates an example of a typical radio receiver.

Conventional antennas, such as that in the typical radio receiver 2000 illustrated in FIG. 20, also tend to become geometrically limited because they use harmonic resonances in the conversion process to increase efficiency. At lower frequencies, this usually creates significant physical problems as these antennas can become quite large. Turning to higher harmonic antennas, i.e., electrically small antennas, in order to solve physical problems, however, usually leads to comprises in bandwidth and matching networks to an even greater extent.

Figure 21:
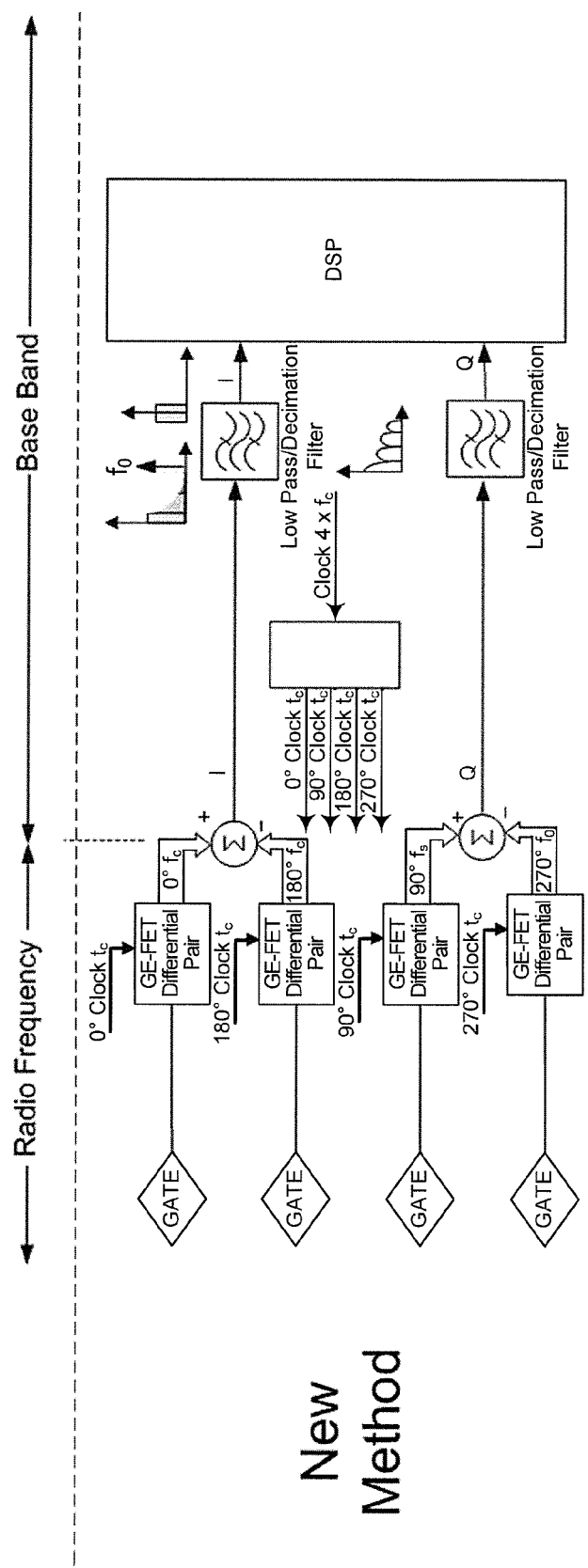
FIG. 21 illustrates an example of a GE-FET SQD radio receiver in accordance with certain embodiments of the disclosed technology.

FIG. 21 illustrates an example of a GE-FET synchronous quad-demodulator (SQD) radio receiver 2100. By implementing a GE-FET in connection with an antenna, the energy "sourced" by the EM wave for a given "gain" tends to be significantly smaller. This may lead to significantly less distortion in the EM wave. Because this energy transfer is very small, many devices may be deployed in a very close array, e.g., on a semiconductor chip, without interfering with one another. This is not possible with a conventional antenna that relies on conduction currents because the act of capturing the EM wave distorts the wave near the antenna. Because GE-FET implementations tend to be naturally very wideband and, consequently, lossy, frequency-dependent matching networks are typically not required. Direct conversion from EM-field to the impulse domain is possible.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. A field effect transistor, comprising:
a film;
a first gate on the film;
at least a second gate on the film;
a ferroelectric material layer covering and in direct contact with at least a portion of each of the first gate, the at least a second gate, and the film between the first gate and the at least a second gate;
an insulating layer substantially covering and in direct contact with the ferroelectric material layer and portions of the film not covered by the ferroelectric material layer;
a source situated above the insulating layer;
a drain situated above the insulating layer; and
a pentacene layer situated above and over the insulating layer.

2. The field effect transistor of claim 1, wherein the ferroelectric material layer comprises one of poly(vinylidene fluoride) (PVDF) and PVDF with trifluoroethylene (PVDF-TrFE).

3. The field effect transistor of claim 1, wherein the ferroelectric material layer comprises a first layer of PVDF-TrFE having a first thickness and a second layer of PVDF-TrFE having a second thickness.

4. The field effect transistor of claim 3, wherein the first and second thicknesses have different values.

5. The field effect transistor of claim 1, wherein at least one of the first gate and the at least a second gate comprises gold.

* * * * *